(12) United States Patent
Chen et al.

(10) Patent No.: US 10,872,892 B2
(45) Date of Patent: Dec. 22, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Lung Chen, Zhubei (TW); Long-Jie Hong, Hsinchu (TW); Kang-Min Kuo, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/443,416

(22) Filed: Jun. 17, 2019

(65) Prior Publication Data

US 2020/0006336 A1 Jan. 2, 2020

Related U.S. Application Data

(60) Provisional application No. 62/692,246, filed on Jun. 29, 2018.

(51) Int. Cl.
| | |
|---|---|
| *H01L 27/088* | (2006.01) |
| *H01L 29/78* | (2006.01) |
| *H01L 29/66* | (2006.01) |
| *H01L 21/285* | (2006.01) |
| *H01L 21/8234* | (2006.01) |
| *H01L 29/08* | (2006.01) |
| *H01L 29/06* | (2006.01) |
| *H01L 29/24* | (2006.01) |
| *H01L 29/16* | (2006.01) |

(52) U.S. Cl.
CPC .... *H01L 27/0886* (2013.01); *H01L 21/28518* (2013.01); *H01L 21/823418* (2013.01); *H01L 21/823431* (2013.01); *H01L 21/823437* (2013.01); *H01L 21/823481* (2013.01); *H01L 29/0649* (2013.01); *H01L 29/0847* (2013.01); *H01L 29/16* (2013.01); *H01L 29/24* (2013.01); *H01L 29/66545* (2013.01); *H01L 29/66795* (2013.01); *H01L 29/785* (2013.01)

(58) Field of Classification Search
CPC ....... H01L 21/28518; H01L 21/823431; H01L 21/823418; H01L 27/0886; H01L 29/66795; H01L 29/785
See application file for complete search history.

(56) References Cited

U.S. PATENT DOCUMENTS

| | | | |
|---|---|---|---|
| 9,570,556 B1 | 2/2017 | Lee et al. | |
| 9,865,504 B2 | 1/2018 | Lee et al. | |
| 2014/0134814 A1* | 5/2014 | Wong | H01L 21/823431 438/283 |
| 2015/0380314 A1 | 12/2015 | Chan et al. | |
| 2015/0380489 A1* | 12/2015 | Chan | H01L 21/823418 257/192 |
| 2017/0018463 A1 | 1/2017 | Bu et al. | |
| 2018/0151564 A1 | 5/2018 | Lee et al. | |

\* cited by examiner

*Primary Examiner* — Changhyun Yi
(74) *Attorney, Agent, or Firm* — McDermott Will & Emery LLP

(57) ABSTRACT

A method of manufacturing a semiconductor device includes forming a first transistor structure and a second transistor structure on a substrate, wherein source/drain structures of the first transistor structure and the second transistor structure are merged. The first and second transistor structures are separated by etching the source/drain structures.

20 Claims, 16 Drawing Sheets

US 10,872,892 B2

SEMICONDUCTOR DEVICE AND MANUFACTURING METHOD THEREOF

CROSS-REFERENCE TO RELATED APPLICATIONS

This application claims priority to U.S. Provisional Patent Application No. 62/692,246, filed Jun. 29, 2018, the entire disclosure of which is incorporated herein by reference.

TECHNICAL FIELD

The disclosure relates to a semiconductor integrated circuit, and more particularly to a semiconductor device having a merged epitaxial source/drain (S/D) structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET) and the use of a metal gate structure with a high-k (dielectric constant) material. The metal gate structure is often manufactured by using gate replacement technologies, and sources and drains are formed by using an epitaxial growth method.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
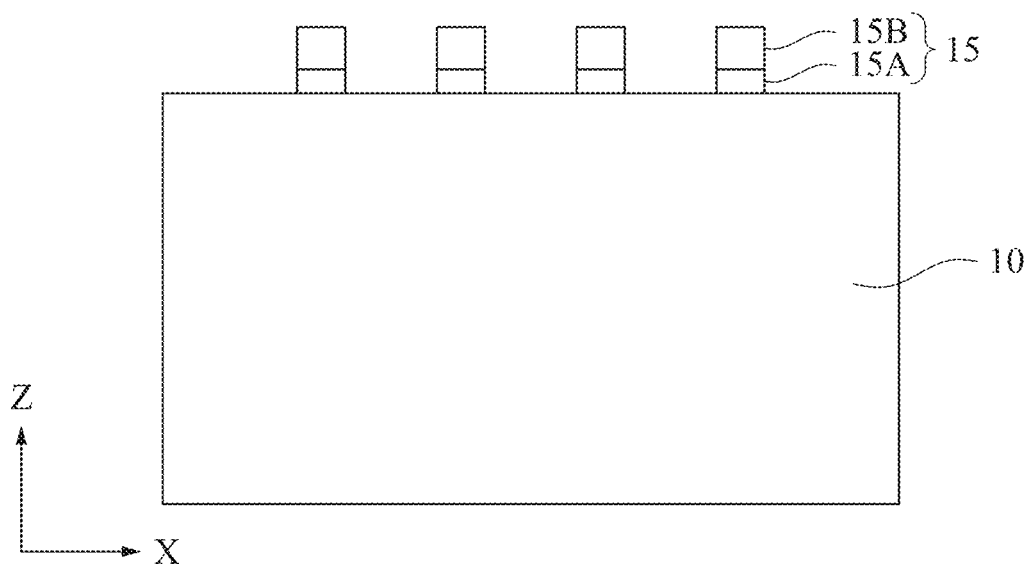
FIG. 1 shows a cross sectional view of one of the various stages for manufacturing a FinFET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

FIGS. 1-12 show exemplary cross sectional views of various stages for manufacturing a FinFET device according to one embodiment of the present disclosure. It is understood that additional operations can be provided before, during, and after processes shown by FIGS. 1-12, and some of the operations described below can be replaced or eliminated, for additional embodiments of the method. The order of the operations/processes may be interchangeable.

A mask layer 15 is formed over a substrate 10. The mask layer 15 is formed by, for example, a thermal oxidation process and/or a chemical vapor deposition (CVD) process. The substrate 10 is, for example, a p-type silicon or germanium substrate with an impurity concentration in a range from about $1 \times 10^{15}$ cm$^{-3}$ to about $1 \times 10^{16}$ cm$^{-3}$. In other embodiments, the substrate is an n-type silicon or germanium substrate with an impurity concentration in a range from about $1 \times 10^{15}$ cm$^{-3}$ to about $1 \times 10^{16}$ cm$^{-3}$.

Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

In some embodiments, the mask layer 15 is a hard mask layer including, for example, a pad oxide (e.g., silicon oxide) layer 15A and a silicon nitride mask layer 15B in some embodiments.

The pad oxide layer 15A may be formed by using thermal oxidation or a CVD process. The silicon nitride mask layer 15B may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer 15A is in a range from about 2 nm to about 15 nm and the thickness of the silicon nitride mask layer 15B is in a range from about 2 nm to about 50 nm in some embodiments. A mask pattern is further formed over the mask layer. The mask pattern is, for example, a resist pattern formed by lithography operations.

By using the mask pattern as an etching mask, the hard mask layer 15 of the pad oxide layer 15A and the silicon nitride mask layer 15B is patterned, as shown in FIG. 1.

Figure 2:
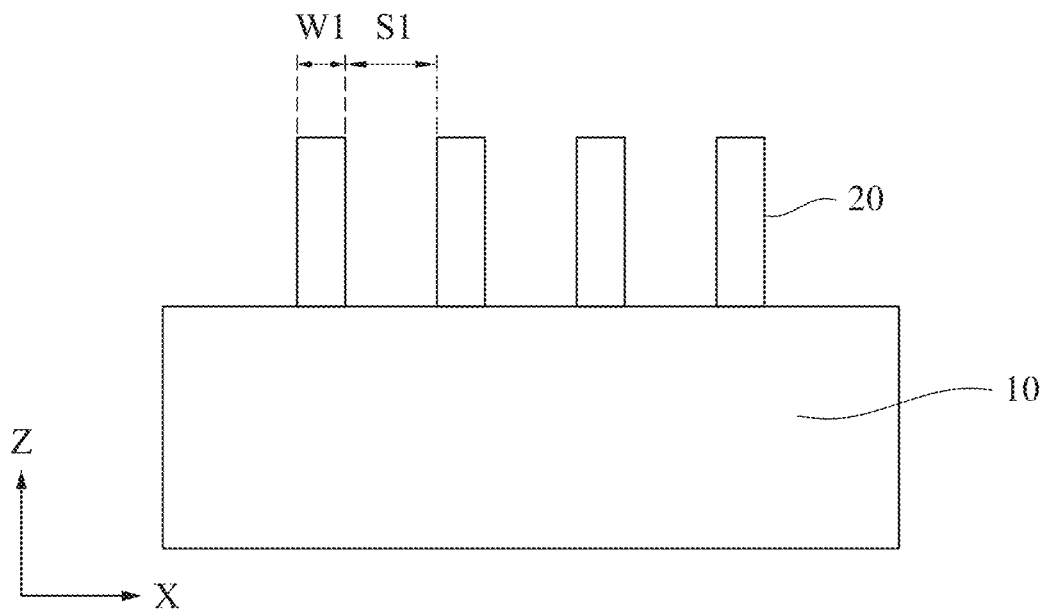
FIG. 2 shows a cross sectional view of one of the various stages for manufacturing a FinFET device according to an embodiment of the present disclosure.

Then, as shown in FIG. 2, by using the patterned hard mask layer 15 as an etching mask, the substrate 10 is patterned into fin structures 20 by trench etching using a dry etching method and/or a wet etching method.

In FIG. 2, four fin structures 20 are disposed over the substrate 10. However, the number of the fin structures is not limited to four. The numbers may be as small as two or more than four. In addition, one or more dummy fin structures may be disposed adjacent both sides of the fin structure 20 to improve pattern fidelity in patterning processes.

The fin structure 20 may be made of the same material as the substrate 10 and may continuously extend from the substrate 10. In this embodiment, the fin structure 20 is made of Si. The silicon layer of the fin structure 20 may be intrinsic, or appropriately doped with an n-type impurity or a p-type impurity.

The width W1 of the fin structure 20 is in a range from about 5 nm to about 40 nm in some embodiments, and is in a range from about 7 nm to about 12 nm in other embodiments. The space S1 between two adjacent fin structures is in a range from about 10 nm to about 50 nm in some embodiments. The height (along the Z direction) of the fin structure 20 is in a range from about 100 nm to about 300 nm in some embodiments, and is in a range from about 50 nm to 100 nm in other embodiments.

The lower part of the fin structure 20 under the gate structure 40 (see, FIG. 5A) may be referred to as a well region, and the upper part of the fin structure 20 may be referred to as a channel region. Under the gate structure 40, the well region is embedded in the isolation insulating layer 30 (see, FIG. 5A), and the channel region protrudes from the isolation insulating layer 30. A lower part of the channel region may also be embedded in the isolation insulating layer 30 to a depth of about 1 nm to about 5 nm.

The height of the well region is in a range from about 60 nm to 100 nm in some embodiments, and the height of the channel region is in a range from about 40 nm to 60 nm, and is in a range from about 38 nm to about 55 nm in other embodiments.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 3:
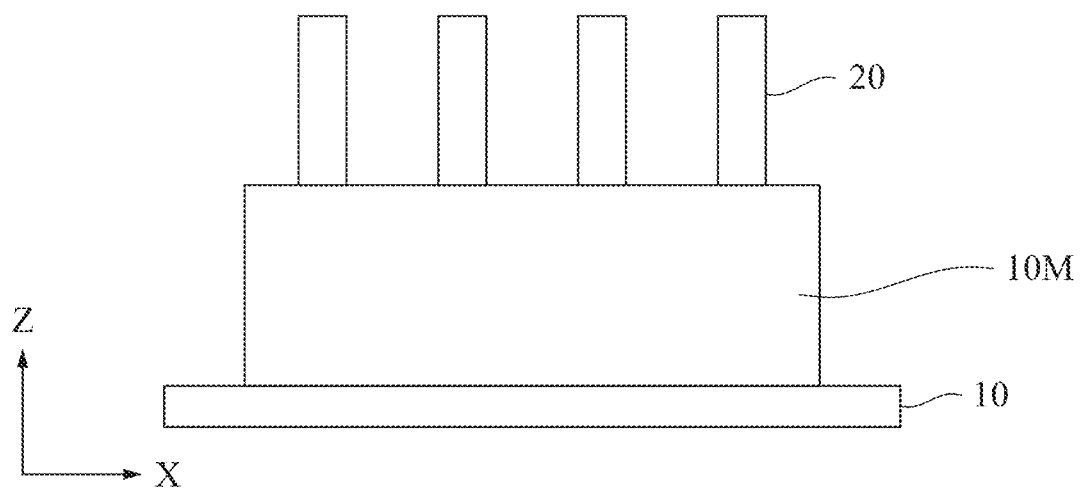
FIG. 3 shows a cross sectional view of one of the various stages for manufacturing a FinFET device according to an embodiment of the present disclosure.

After the fin structures 20 are formed, the substrate 10 is further etched to form a mesa shape 10M, as shown in FIG. 3. In other embodiments, the mesa shape 10M is first formed, and then the fin structures 20 are formed over the mesa shape 10M.

After the fin structures 20 and the mesa shape 10M are formed, the isolation insulating layer 30 is formed in spaces between the fin structures and/or a space between one fin structure and another element formed over the substrate 10. The isolation insulating layer 30 may also be called a "shallow-trench-isolation (STI)" layer. The insulating material for the isolation insulating layer 30 may include one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous.

Figure 4:
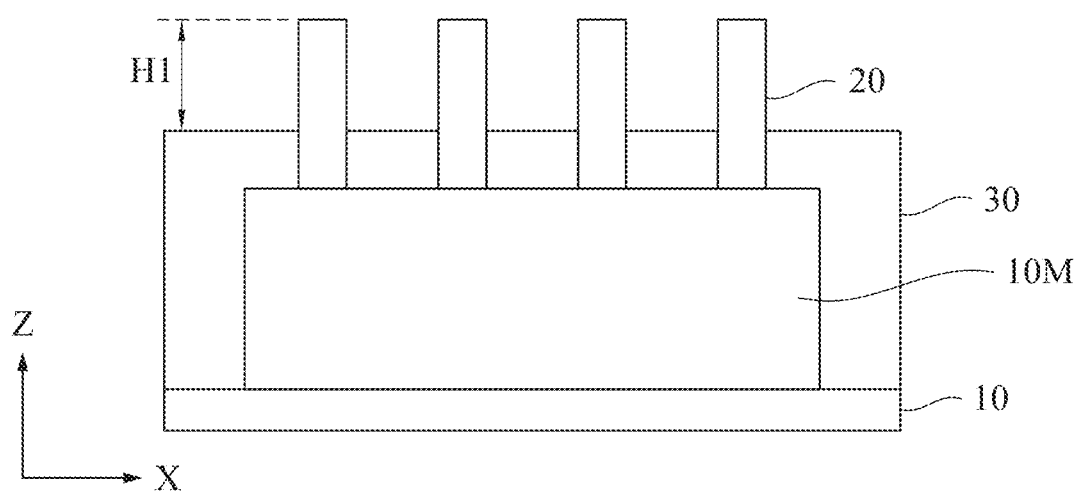
FIG. 4 shows a cross sectional view of one of the various stages for manufacturing a FinFET device according to an embodiment of the present disclosure.

The isolation insulating layer 30 is first formed in a thick layer so that the fin structures are embedded in the thick layer, and the thick layer is recessed so as to expose the upper portions of the fin structures 20, as shown in FIG. 4. The height H1 of the fin structures from the upper surface of the isolation insulating layer 30 is in a range from about 20 nm to about 100 nm in some embodiments, and is in a range from about 30 nm to about 50 nm in other embodiments. After or before recessing the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar, or He ambient.

Figure 5A:
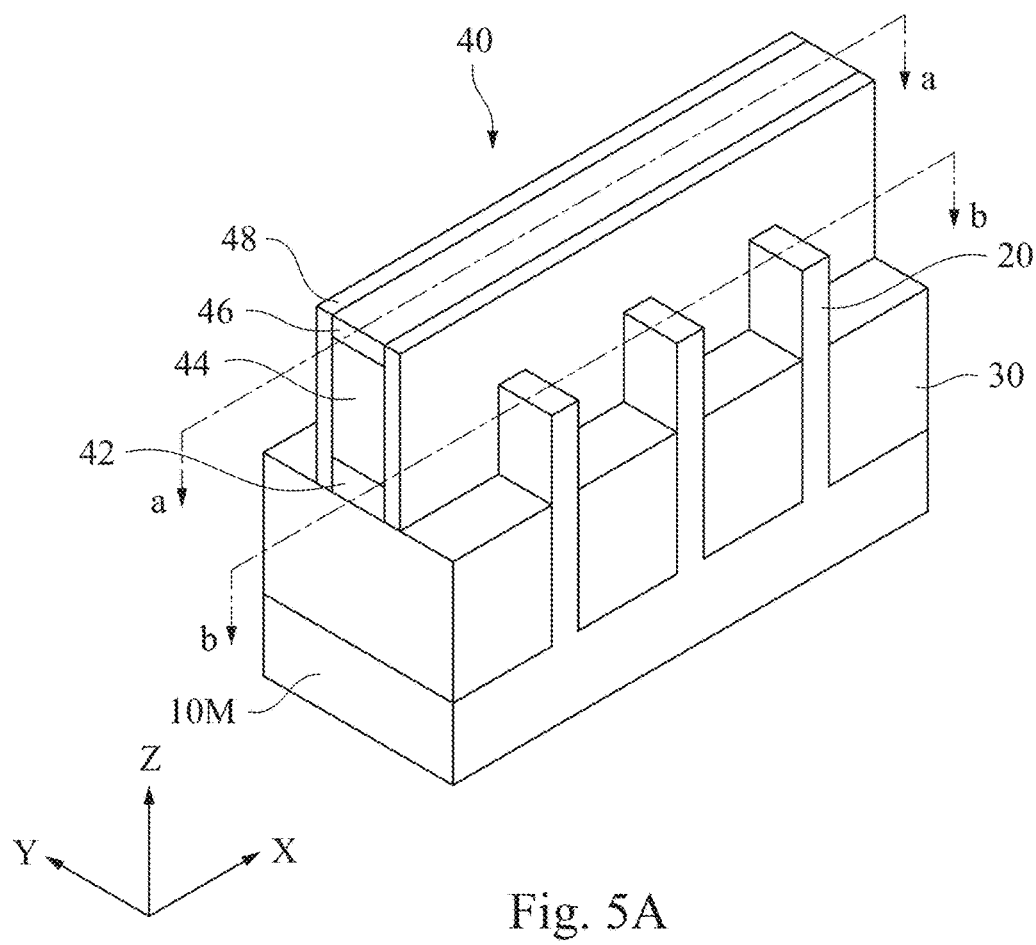
FIG. 5A shows a schematic isometric view of one of the various stages for manufacturing a FinFET device according to an embodiment of the present disclosure.
Figure 5B:
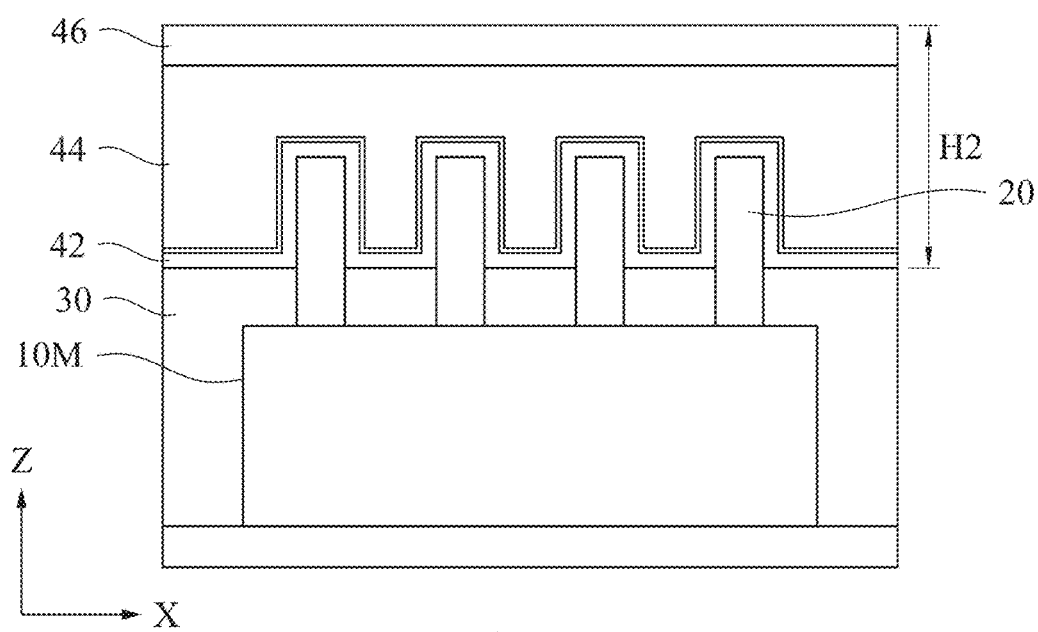
FIG. 5B shows a cross sectional view along line a-a of FIG. 5A.
Figure 5C:
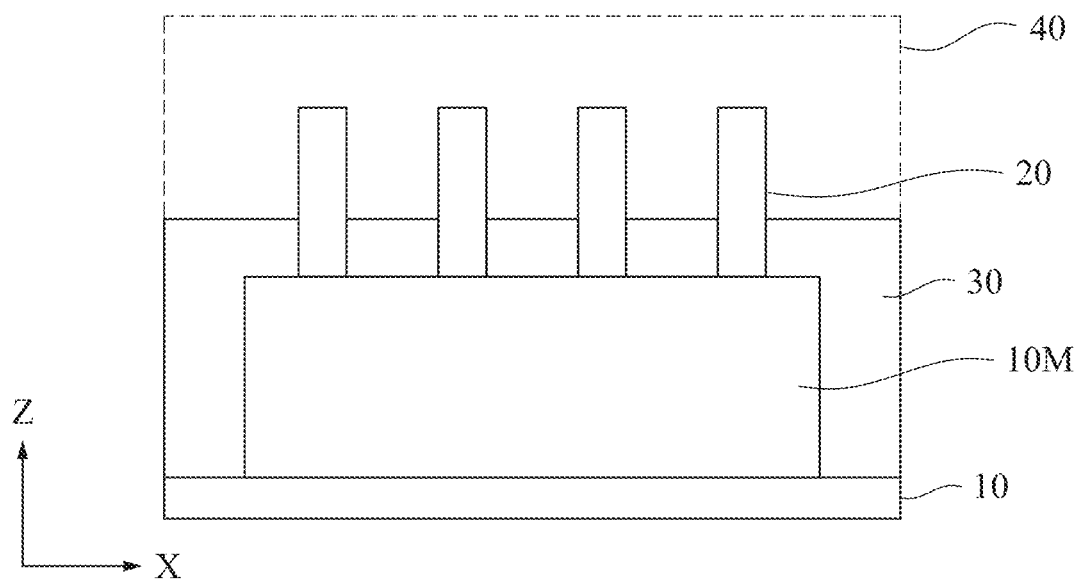
FIG. 5C shows a cross sectional view along line b-b of FIG. 5A.

After the isolation insulating layer 30 is formed, a gate structure 40 is formed over the fin structures 20, as shown in FIGS. 5A-5C. FIG. 5A is an exemplary perspective view showing three fin structures to simplify the disclosure, but it is understood that there are four or more fin structures disposed on the substrate in some embodiments. FIG. 5B is an exemplary cross sectional view along line a-a of FIG. 5A and FIG. 5C is an exemplary cross sectional view along line b-b of FIG. 5A. FIGS. 6-15 are also exemplary cross sectional views along line b-b of FIG. 5A.

As shown in FIG. 5A, the gate structure 40 extends in the X direction, while the fin structures 20 extend in the Y direction.

To fabricate the gate structure 40, a dielectric layer and a poly silicon layer are formed over the isolation insulating layer 30 and the exposed fin structures 20, and then patterning operations are performed so as to obtain gate structures including a gate pattern 44 made of polysilicon and a dielectric layer 42. In some embodiments, the polysilicon layer is patterned by using a hard mask and the hard mask remains on the gate pattern 44 as a cap insulating layer 46 of the gate structure 40. The hard mask (cap insulating layer 46) includes one or more layers of insulating material. The cap insulating layer 46 includes a silicon nitride layer formed over a silicon oxide layer in some embodiments. In other embodiments, the cap insulating layer 46 includes a silicon oxide layer formed over a silicon nitride layer. The insulating material for the cap insulating layer 46 may be formed by CVD, PVD, ALD, e-beam evaporation, or other suitable process. In some embodiments, the dielectric layer 42 may include one or more layers of silicon oxide, silicon nitride, silicon oxynitride, or high-k dielectrics. In some embodiments, a thickness of the dielectric layer 42 is in a range from about 2 nm to about 20 nm, and in a range from about 2 nm to about 10 nm in other embodiments. The height H2 of the gate structures, including the optional cap insulating layer 46 is in a range from about 50 nm to about 400 nm in some embodiments, and is in a range from about 100 nm to 200 nm in other embodiments.

In some embodiments, a gate replacement technology is employed. In such a case, the gate pattern 44 and the dielectric layer 42 are a dummy gate electrode and a dummy gate dielectric layer, respectively, which are subsequently removed. If a gate-first technology is employed, the gate pattern 44 and the dielectric layer 42 are used as a gate electrode and a gate dielectric layer.

Further, gate sidewall spacers 48 are formed on both sidewalls of the gate pattern. The sidewall spacers 48 include one or more layers of insulating material, such as $SiO_2$, $Si_3N_4$, SiON, SiOCN or SiCN, which are formed by CVD, PVD, ALD, e-beam evaporation, or other suitable process. A low-k dielectric material may be used as the sidewall spacers. The sidewall spacers 48 are formed by forming a blanket layer of insulating material and performing anisotropic etching. In one embodiment, the sidewall spacer layers are made of silicon nitride based material, such as $Si_3N_4$, SiON, SiOCN or SiCN.

Figure 6:
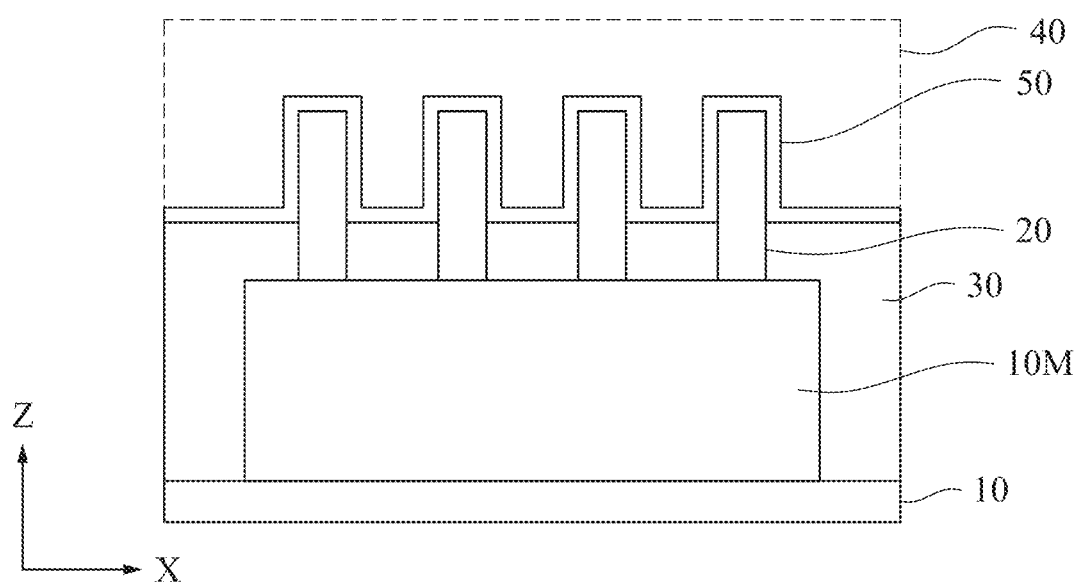
FIG. 6 shows a cross sectional view of one of the various stages for manufacturing a FinFET device according to an embodiment of the present disclosure.

Then, as shown in FIG. 6, a fin sidewall 50 is formed over the fin structures 20. The fin sidewall 50 is made of dielectric material including silicon nitride based material, such as $Si_3N_4$, SiON, SiOCN or SiCN. In one embodiment, $Si_3N_4$ is used as the fin sidewall 50. The fin sidewall 50 is formed by CVD, PVD, ALD, e-beam evaporation, or other suitable process. The thickness of the fin sidewall 50 is in a range from about 30 nm to about 70 nm in some embodiments.

In some embodiments, the fin sidewall 50 and the sidewall spacers 48 for the gate structure are separately formed. In other embodiments, the same blanket layer is used for the fin sidewall 50 and the sidewall spacers 48.

Figure 7:
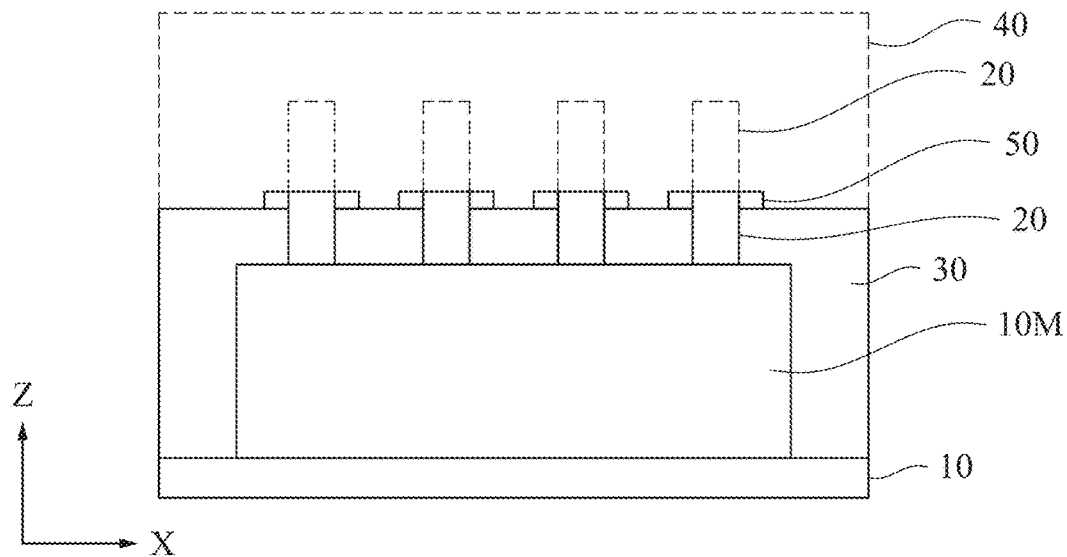
FIG. 7 shows a cross sectional view of one of the various stages for manufacturing a FinFET device according to an embodiment of the present disclosure.

After forming the fin sidewall 50, the upper portion of the fin structures 20 in the region where the source/drain (S/D) structures will be formed, are recessed and a part of the fin sidewall 50 disposed on the top surface of the fin structures protruding from the isolation insulating layer is removed by a dry etching and/or a wet etching operation. The upper portion of the fin structures 20 are recessed (etched) down to the level equal to or below the upper surface of the fin sidewall 50 on the upper surface isolation insulating layer 30, as shown in FIG. 7. By adjusting etching conditions, for example, an over-etching time, the fin sidewall 50 remains on the side surfaces of the fin structures 20. The thickness of the remaining fin sidewall 50 is in a range from about 2 nm to about 10 nm in some embodiments. In other embodiments, the fin sidewall 50 is fully removed from the side surfaces of the fin structures 20.

Figure 8:
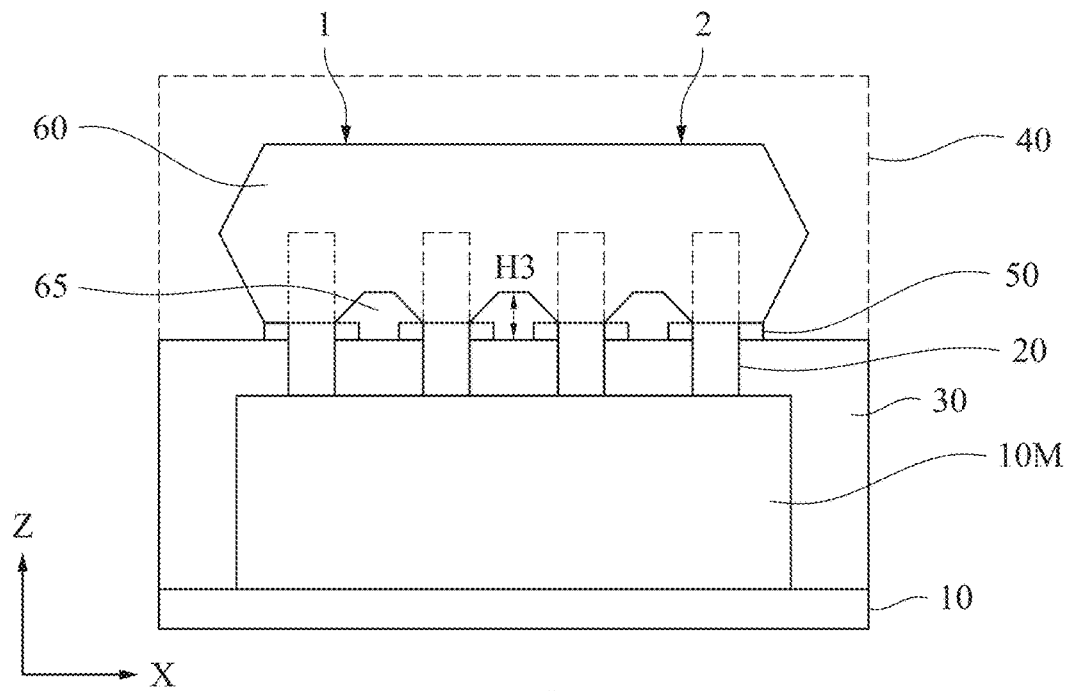
FIG. 8 shows a cross sectional view of one of the various stages for manufacturing a FinFET device according to an embodiment of the present disclosure.

Then, as shown in FIG. 8, an epitaxial source/drain structure 60 is formed over the recessed fin structures 20. The epitaxial source/drain structure 60 is made of one or more layers of semiconductor material having a different lattice constant than the fin structures 20 (channel regions). When the fin structures are made of Si, the epitaxial source/ drain structure 60 includes SiP, SiC or SiCP for an n-channel Fin FET and SiGe or Ge for a p-channel Fin FET. The epitaxial source/drain structure 60 is epitaxially formed over the upper portions of the recessed fin structures. Due to the crystal orientation of the substrate formed into the fin structures 20 (e.g., (100) plane), the epitaxial source/drain structure 60 grows laterally and has a diamond-like shape in some embodiments.

The source/drain epitaxial layer 60 may be grown at a temperature of about 600° C. to 800° C. under a pressure of about 80 Torr to 150 Torr, by using a Si containing gas such as $SiH_4$, $Si_2H_6$ or $SiCl_2H_2$, a Ge containing gas, such as $GeH_4$, $Ge_2H_6$ or $GeCl_2H_2$, a C containing gas, such as $CH_4$ or $C_2H_6$, and/or a dopant gas, such as $PH_3$. The source/drain structure for an n-channel FET and the source/drain structure for a p-channel FET may be formed by separate epitaxial processes.

Due to the relatively small space between the fin structures and the fin sidewall 50 remaining on the upper surface of the isolation insulating layer between the fin structures, the adjacent epitaxial source/drain structures formed over each of the first fin structures 20 are merged such that a void or a gap (an air gap) 65 is formed by the merged epitaxial source/drain structure 60 and the fin sidewall 50 on the upper surface of the isolation insulating layer 30, as shown in FIG. 8. Because the source/drain structure formed on adjacent fins merges, the diamond-like structure of the merged epitaxial source/drain structure 60 is most apparent at the opposing ends of the merged epitaxial source/drain structure 60 in some embodiments.

In some embodiments, the height H3 of the void is in a range from about 10 nm to about 30 nm measured from the upper surface of isolation insulating layer 30, and in a range from about 15 nm to about 25 nm in other embodiments.

In some embodiments, some of the fin structures 20 will form a first semiconductor device 1 and some of the other fin structures will form a second semiconductor device 2. In some embodiments, the first semiconductor device 1 includes a first transistor structure 1 and the second semiconductor device 2 includes a second transistor structure 2. In some embodiments, the first and second transistor structures 1, 2 form field effect transistors.

Figure 9:
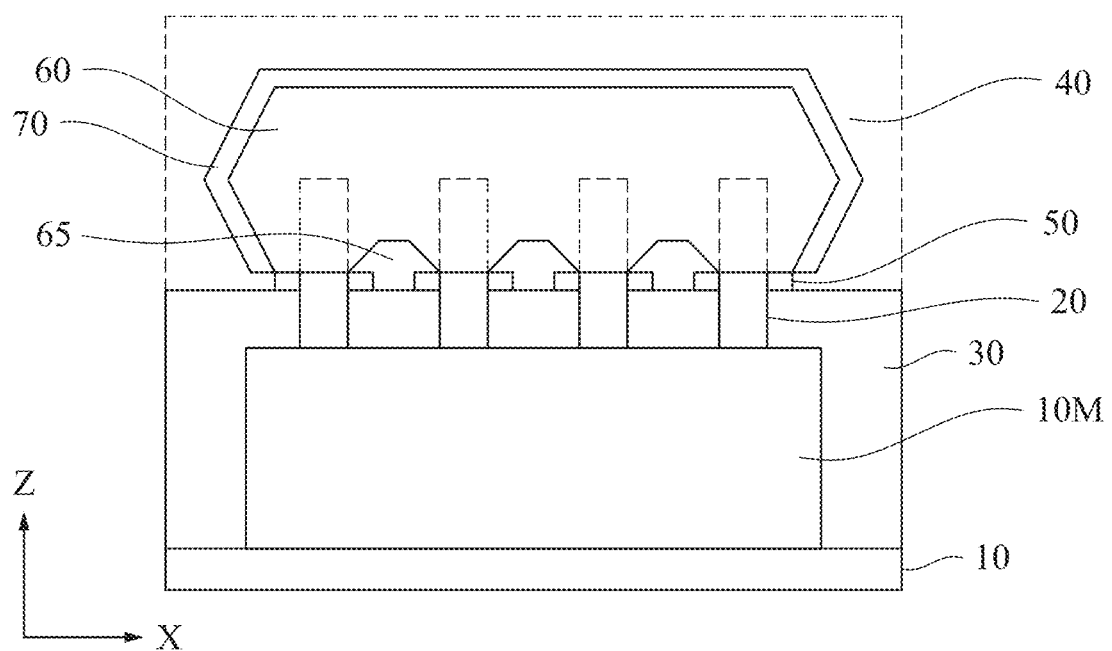
FIG. 9 shows a cross sectional view of one of the various stages for manufacturing a FinFET device according to an embodiment of the present disclosure.

After the epitaxial source/drain structure 60 is formed, as shown in FIG. 9, a silicide layer 70 is formed over the epitaxial source/drain structure 60 in some embodiments.

A metal material, such as Ni, Ti, Ta, and/or W, is formed over the epitaxial source/drain structure 60, and an annealing operation is performed to form a silicide layer 70. In other embodiments, a silicide material, such as NiSi, TiSi, TaSi, and/or WSi, is formed over the epitaxial source/drain structure 60, and an annealing operation may be performed. The annealing operation is performed at a temperature of about 250° C. to about 850° C. The metal material or the silicide material is formed by CVD or ALD. The thickness of the silicide layer 70 is in a range from about 4 nm to about 10 nm in some embodiments. Before or after the annealing operations, the metal material or the silicide material formed over the isolation insulating layer 30 is selectively removed.

Then, a metal gate structure (not shown) is formed. After forming the silicide layer 70, the dummy gate structures (dummy gate electrode 44 and dummy gate dielectric layer 42) are removed and replaced with a metal gate structures (metal gate electrode and gate dielectric layer). In some embodiments, the cap insulating layer 46 is also removed when the gate electrode 44 and the gate dielectric layer 42 are removed.

Figure 10:
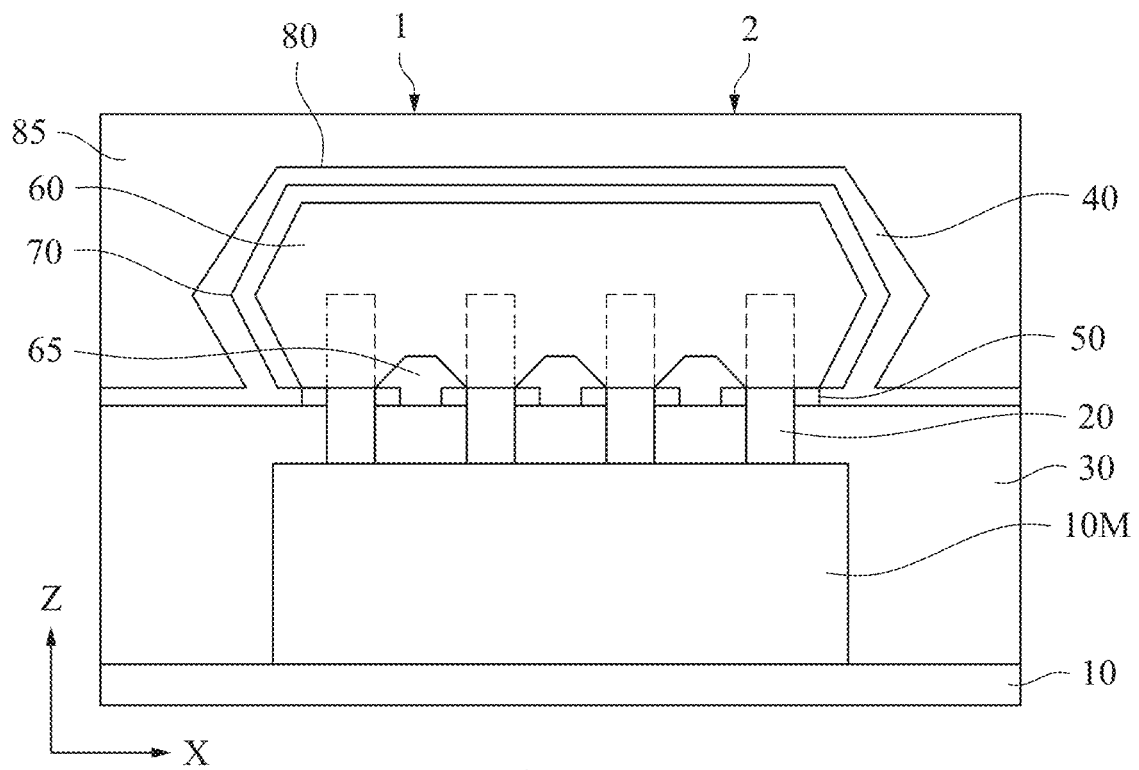
FIG. 10 shows a cross sectional view of one of the various stages for manufacturing a FinFET device according to an embodiment of the present disclosure.

As shown in FIG. 10, in some embodiments, an interlayer dielectric layer 85 is formed over the source/drain epitaxial structures and dummy gate structures and a planarization operation, such as a chemical mechanical polishing (CMP) process or an etch-back process, is performed to expose the upper surface of the dummy gate electrode 44. Then, the dummy gate electrode 44 and the dummy gate dielectric layer 42 are removed by appropriate etching processes, respectively, to form a gate opening. Metal gate structures including a gate dielectric layer and metal gate electrode are formed in the gate openings. In some embodiments, an additional interlayer dielectric layer is formed over the first interlayer dielectric layer and the metal gate structures.

The gate dielectric layer may be formed over an interface layer (not shown) disposed over the channel layer of the fin structures 20. The interface layer may include silicon oxide or germanium oxide with a thickness of 0.2 nm to 1.5 nm in some embodiments. In other embodiments, the thickness of the interface layer is in a range about 0.5 nm to about 1.0 nm.

The gate dielectric layer includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer is in a range from about 1 nm to about 10 nm in some embodiments, and may be in a range from about 2 nm to about 7 nm in other embodiments.

The metal gate electrode is formed over the gate dielectric layer. The metal gate electrode includes one or more layers of any suitable metal material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments of the present disclosure, one or more work function adjustment layers (not shown) may be interposed between the gate dielectric layer and the metal gate electrode. The work function adjustment layer is made of a conductive material such as a single layer of TiN, TaN, TaAlC, TiC, TaC, Co, Al, TiAl, HfTi, TiSi, TaSi, or TiAlC, or a multilayer of two or more of these materials. For the n-channel Fin FET, one or more of TaN, TaAlC, TiN, TiC, Co, TiAl, HfTi, TiSi, and TaSi is used as the work function adjustment layer, and for the p-channel Fin FET, one or more of TiAlC, Al, TiAl, TaN, TaAlC, TiN, TiC and Co is used as the work function adjustment layer.

After depositing appropriate materials for the metal gate structures, planarization operations, such as CMP, are performed.

In some embodiments, as shown in FIG. 10, an insulating layer 80, functioning as a contact etching stop layer, is formed over the formed metal gate structure and the source/drain structures 60 before forming the interlayer dielectric layer 85. The insulating layer 80 is one or more layers of insulating material. In one embodiment, the insulating layer 80 is made of silicon nitride formed by CVD.

Figure 11:
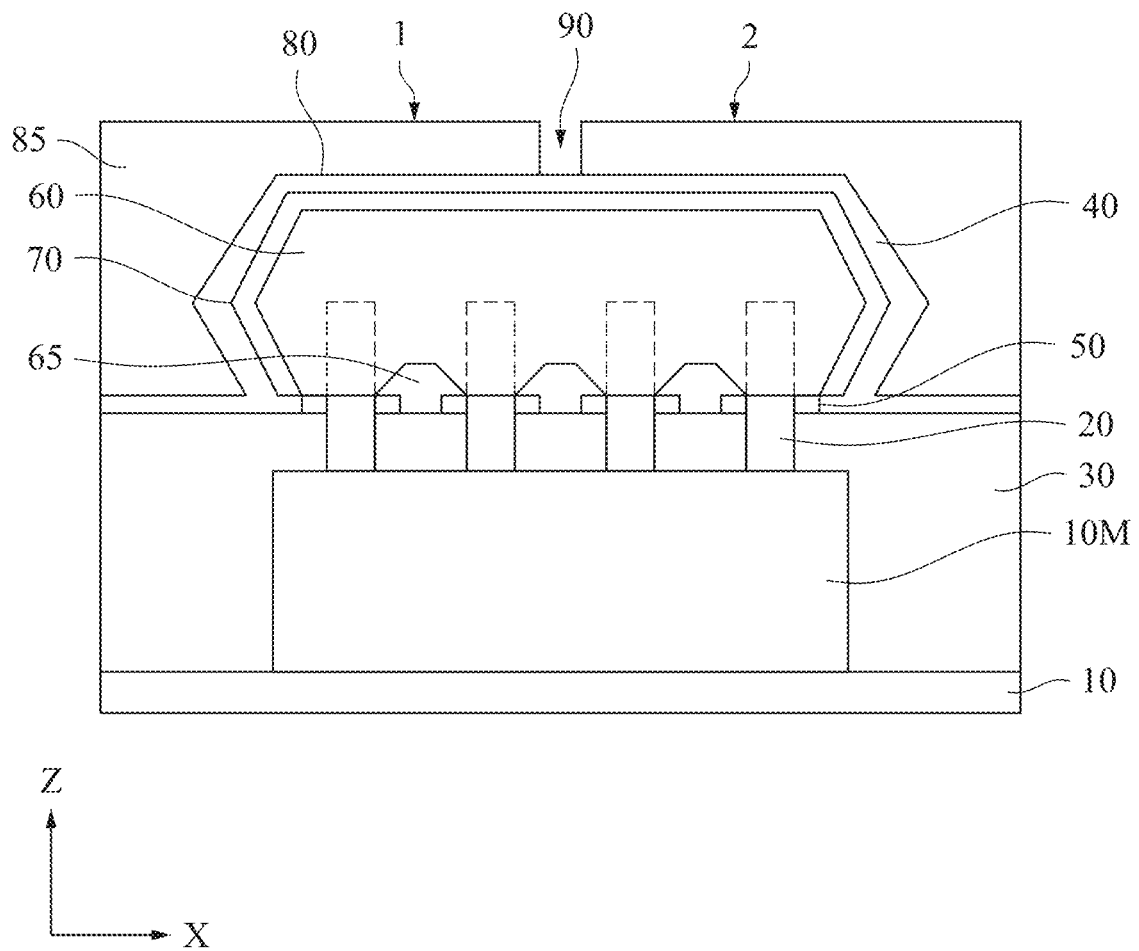
FIG. 11 shows a cross sectional view of one of the various stages for manufacturing a FinFET device according to an embodiment of the present disclosure.
Figure 12:
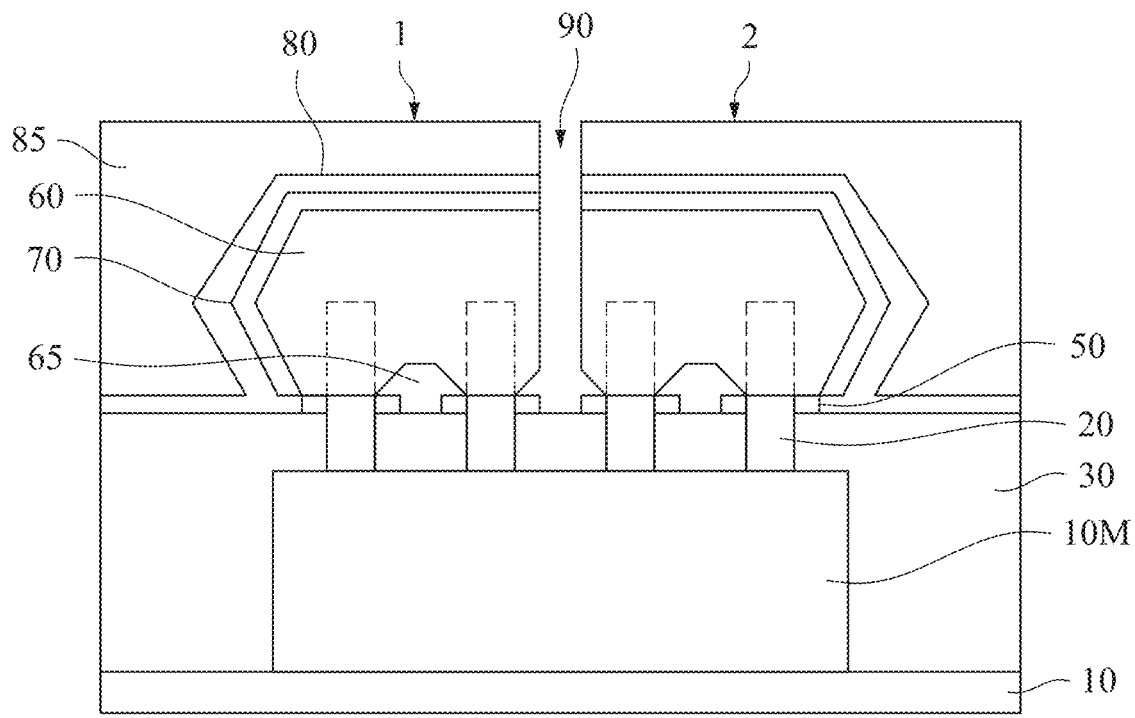
FIG. 12 shows a cross sectional view of one of the various stages for manufacturing a FinFET device according to an embodiment of the present disclosure.

By using a patterning operation, a gap 90 is formed in the interlayer dielectric layer 85, as shown in FIG. 11. In some embodiments, a photoresist layer is formed over the interlayer dielectric layer 85. The photoresist layer is photolithographically patterned to expose the portion of the dielectric layer 85 where the gap 90 is to be formed. The gap 90 in the interlayer dielectric layer 85 is formed by etching, such as by anisotropic dry etching, including plasma dry etching in some embodiments. The gap 90 is then extended into the insulating layer 80 and the source/drain structures 60 so as to separate the source/drain structures 60 of adjacent devices thereby forming a first transistor structure 1 and a second transistor structure 2, such as fin field effect transistors, as shown in FIG. 12. Suitable etchants are used to selectively etch the interlayer dielectric layer 85, insulating layer 80, and source/drain structures 60 to form the substantially straight-walled gap 90 and separate the first transistor structure 1 and second transistor structure 2. In some embodiments, plasma dry etching is performed to extend the gap through the source/drain structures 60.

The etching operation may include multiple etching processes using different plasma gases. When a Si based material is used as the second source/drain structures 60, the etching can be performed by plasma dry etching using, for example, a gas including HBr or a gas including $Cl_2$ and $SF_6$. When a Si oxide based material is used as the interlayer dielectric layer 85, the etching can be performed by plasma dry etching using, for example, a gas including a fluorocarbon and/or fluorine. During the etching, the substrate may be heated at a temperature between about 20° C. to about 200° C.

Figure 13:
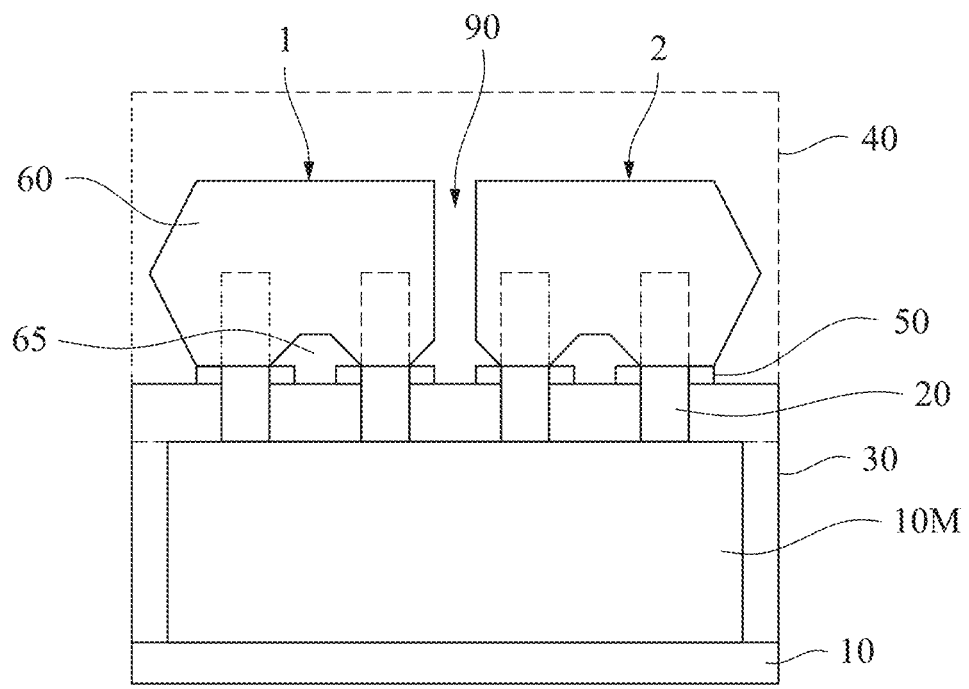
FIG. 13 shows a cross sectional view of one of the various stages for manufacturing a FinFET device according to another embodiment of the present disclosure.
Figure 14:
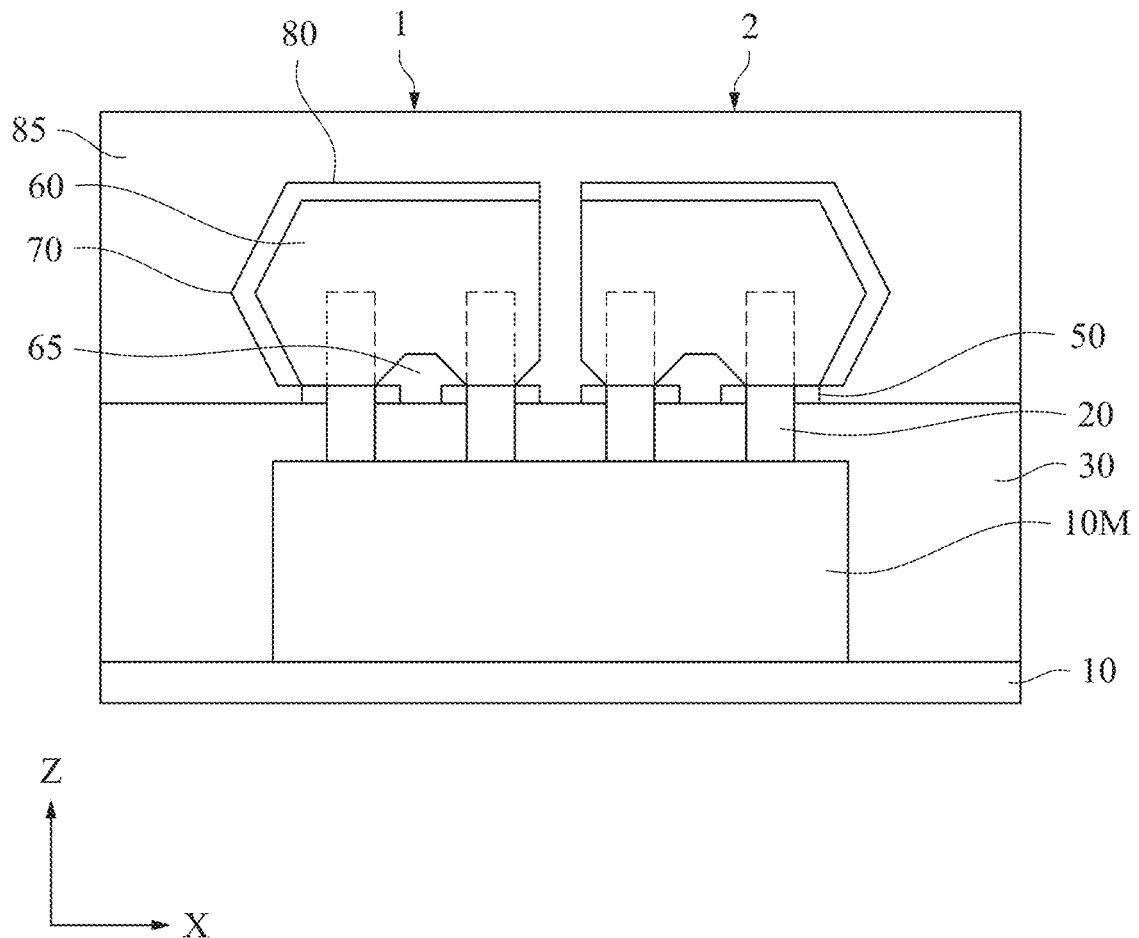
FIG. 14 shows a cross sectional view of one of the various stages for manufacturing a FinFET device according to another embodiment of the present disclosure.
Figure 15:
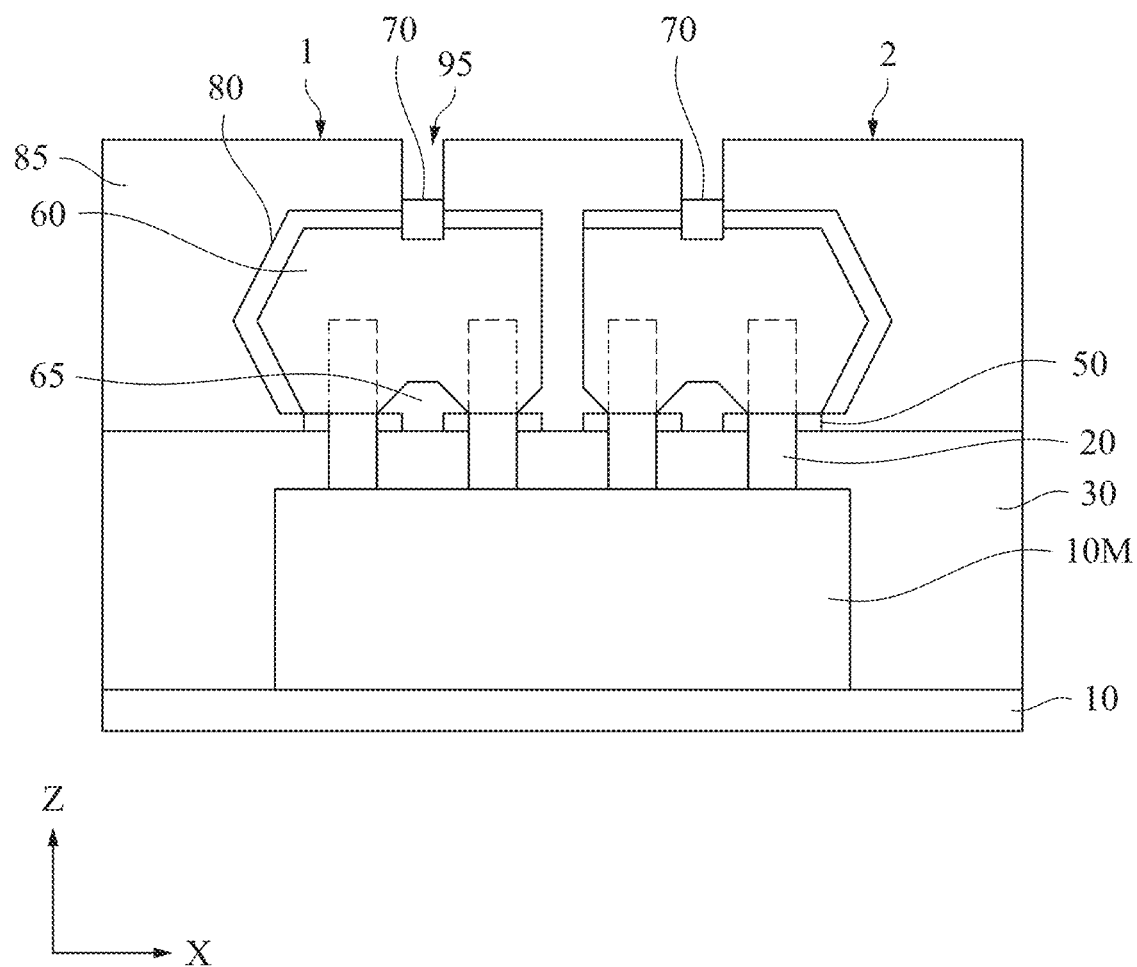
FIG. 15 shows a cross sectional view of one of the various stages for manufacturing a FinFET device according to another embodiment of the present disclosure.
Figure 16:
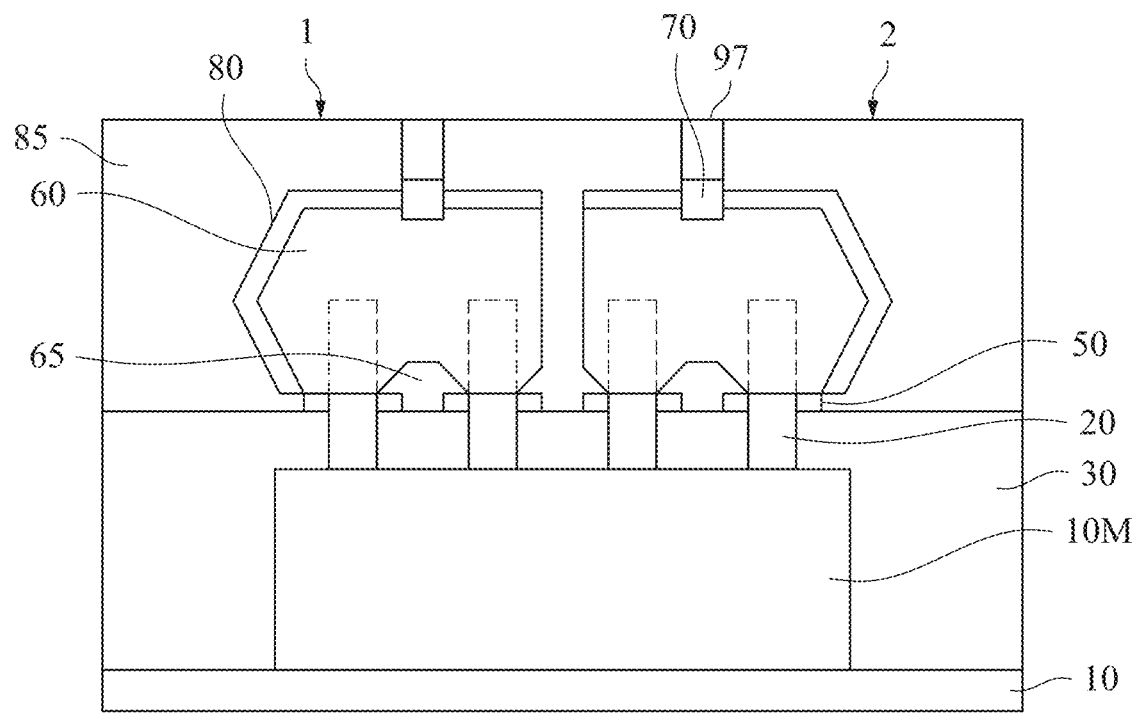
FIG. 16 shows a cross sectional view of one of the various stages for manufacturing a FinFET device according to another embodiment of the present disclosure.

In some embodiments, the silicide layer 70 is formed after the gap 90 is formed. In such a case, after forming the epitaxial source/drain structure 60 as shown in FIG. 8, the gap 90 is formed, as shown in FIG. 13. Then the insulating layer 80 (contact etch stop layer), the interlayer dielectric layer 85, and the metal gate structures are formed, without forming a silicide layer, as shown in FIG. 14. Then, a contact hole 95 is formed in the insulating layer 80 and the interlayer dielectric layer 85 to expose the upper surface of the epitaxial source/drain structure 60, and then a silicide layer 70 is formed on the upper surface of the epitaxial source/drain structure 60, as shown in FIG. 15. The contact hole 95 is subsequently filled with an electrically conductive material, such as a metal, including copper, aluminum, or tungsten to form an electrically conductive contact 97, as shown in FIG. 16.

In some embodiments, after the epitaxial source/drain structure 60 is formed the gap 90 is formed, then the silicide layer 70 is formed over the epitaxial source/drain structure 60. Next, the contact etch stop layer 80 (CESL) is formed, and then the interlayer dielectric layer (ILD) 85 is formed over the epitaxial source/drain structure 60 to protect the epitaxial source/drain structure during a subsequent gate replacement operation.

In some embodiments, dummy polysilicon gate electrodes and silicon oxide gate dielectric layers are replaced by metal gates and high-k gate dielectric layers. Vias are also subsequently formed in the ILD 85 and conductive contacts to the epitaxial source/drain structures 60 are formed in the vias after the gate replacement operation in some embodiments.

After forming the gap, further CMOS processes are performed to form various features such as additional interlayer dielectric layer, contacts/vias, interconnect metal layers, and passivation layers, etc.

FIGS. 17-20 show exemplary cross sectional views of various stages for manufacturing a FinFET device according to another embodiment of the present disclosure. It is understood that additional operations can be provided before, during, and after processes shown by FIGS. 17-20, and some of the operations described below can be replaced or eliminated, for additional embodiments of the method. The order of the operations/processes may be interchangeable.

Figure 17:
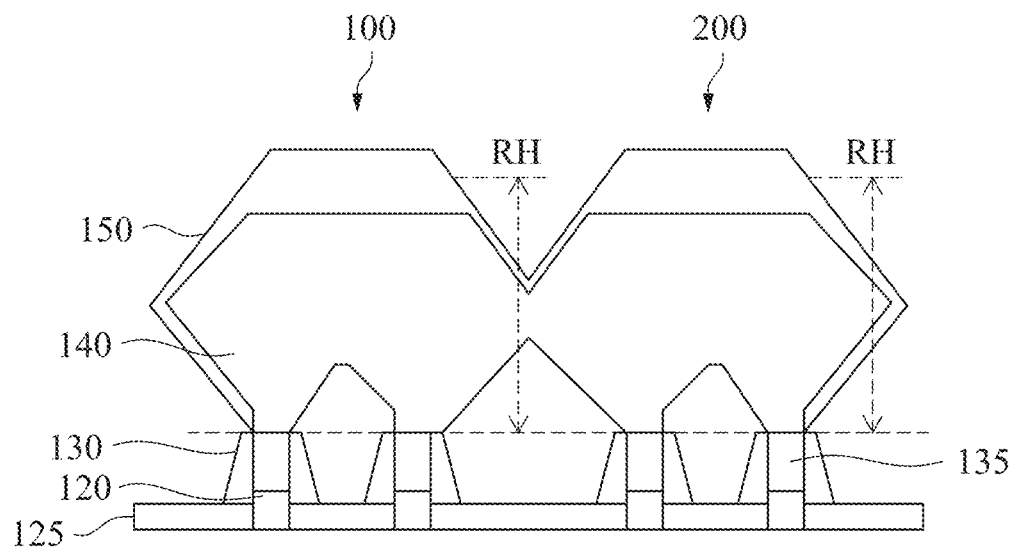
FIG. 17 shows a cross sectional view of one of the various stages for manufacturing a FinFET device according to another embodiment of the present disclosure.

Merged source/drain structures are formed over recessed fin structures 120, as shown in FIG. 17. The source/drain structures include two epitaxial regions in some embodiments, a first region including SiP 140 and a second silicon-rich region 150 disposed over the first region 140. The second region 150 has a lower concentration of P dopant than the first region 140. In some embodiments, two semiconductor devices 100, 200 are to be formed on a substrate (not shown). In some embodiments, the semiconductor devices 100, 200 are transistors formed from the transistor structures illustrated in FIG. 17. The source/drain structures are purposely merged during the source/drain structure formation operation. In some embodiments, adjacent fin structures 120 of the first device 100 and the second device 200 are separated by a distance S2 of about 25 nm to about 75 nm. In some embodiments, adjacent fin structures 120 of the first and second devices 100, 200 are separated by a distance of about 50 nm. In some embodiments, the fin structures 120 are surrounded by a residual portion of the fin sidewall 130. In some embodiments a spacer 135 is disposed over the recessed fin structure 120 before the epitaxial source/drain regions 140, 150 are formed. In some embodiments, the spacer 135 is formed of a semiconductor material. In some embodiments, the fin structures 120 are separated by a shallow trench isolation layer 125. In some embodiments, the epitaxial source/drain structures 140, 150 are grown to a reference height RH from the top of the fin structure 20. The reference height RH is selected to be within a certain range so that the source/drain structures 140, 150 of adjacent devices 100, 200 merge. If the reference height RH is too low the source/drain structures will not be large enough to perform satisfactorily, i.e.—high resistance. The reference height needs to be large enough for the source/drain structures to operate properly. When forming source/drain regions with sufficient height, source/drain structures on adjacent devices may merge if the adjacent devices are closely spaced. In some embodiments, the reference height RH measured from the top of the fin structures in the source/drain regions is from about 20 nm to about 150 nm. In some embodiments, height RH of the source/drain structures measured from the top of the fin structures ranges from about 60 nm to about 100 nm. In embodiments of the present disclosure, source/drain structures are deliberately merged at this stage of the manufacturing operation.

Figure 18:
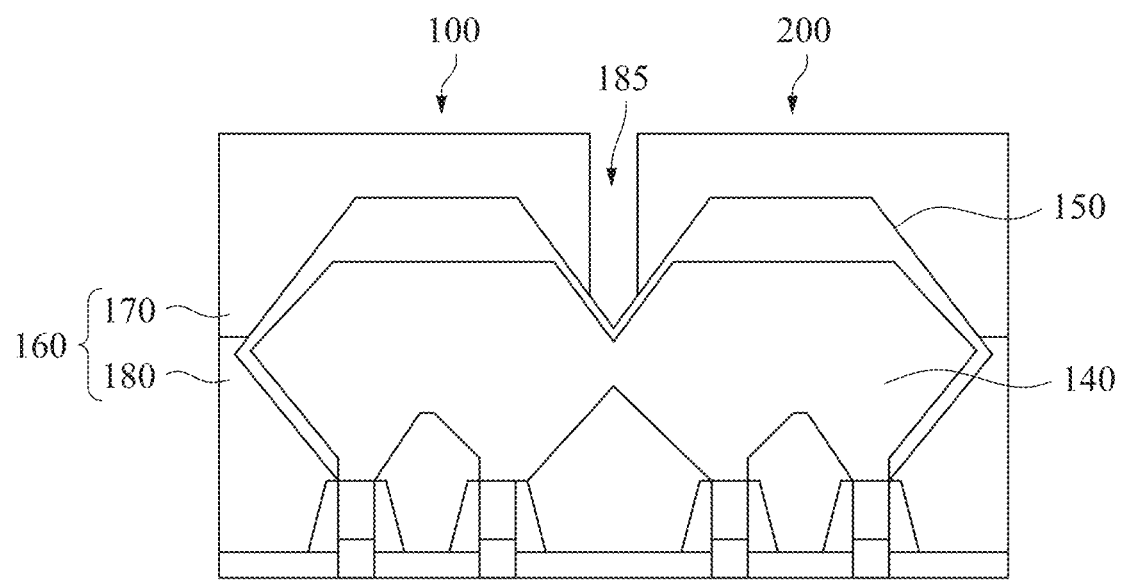
FIG. 18 shows a cross sectional view of one of the various stages for manufacturing a FinFET device according to another embodiment of the present disclosure.

After forming the source/drain structures, a silicon nitride based material, such as $Si_3N_4$, SiON, SiOCN or SiCN (not shown), is formed as a CESL over the source/drain structures. Then a photoresist 160, such as a bilayer photoresist (first layer 180, second layer 170) is formed over the first and second devices 100, 200, and the photoresist is patterned by exposure to actinic radiation, and developed to form a gap 185 between the first and second devices 100, 200, as shown in FIG. 18. In some embodiments, the first layer 180 of the bilayer photoresist is a planarizing and/or bottom anti-reflective coating (BARC). The second layer 170 of the bilayer photoresist is sensitive to deep UV radiation.

Figure 19:
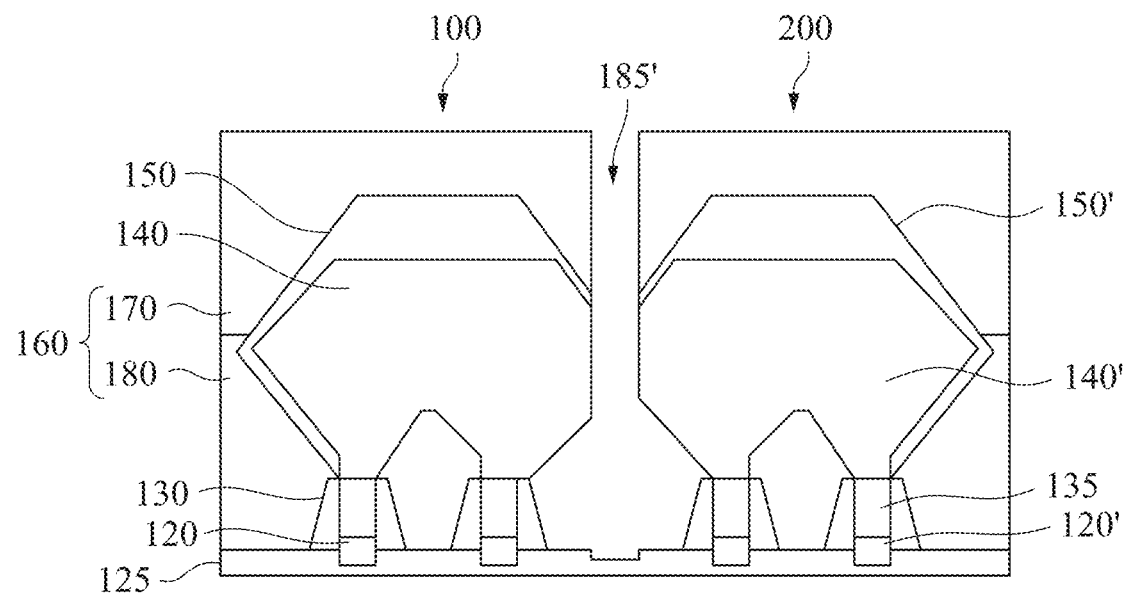
FIG. 19 shows a cross sectional view of one of the various stages for manufacturing a FinFET device according to another embodiment of the present disclosure.

Next, source/drain structure 60 is cut by etching to extend the gap 185' through the source/drain structures 140, 150 thereby separating the first semiconductor device 100 and the second semiconductor device 200, as shown in FIG. 19. In some embodiments, the etching is wet or dry etching. In some embodiments, the etching is anisotropic plasma dry etching. In some embodiments, a portion of the underlying STI layer 125 is etched due to overetching.

Figure 20:
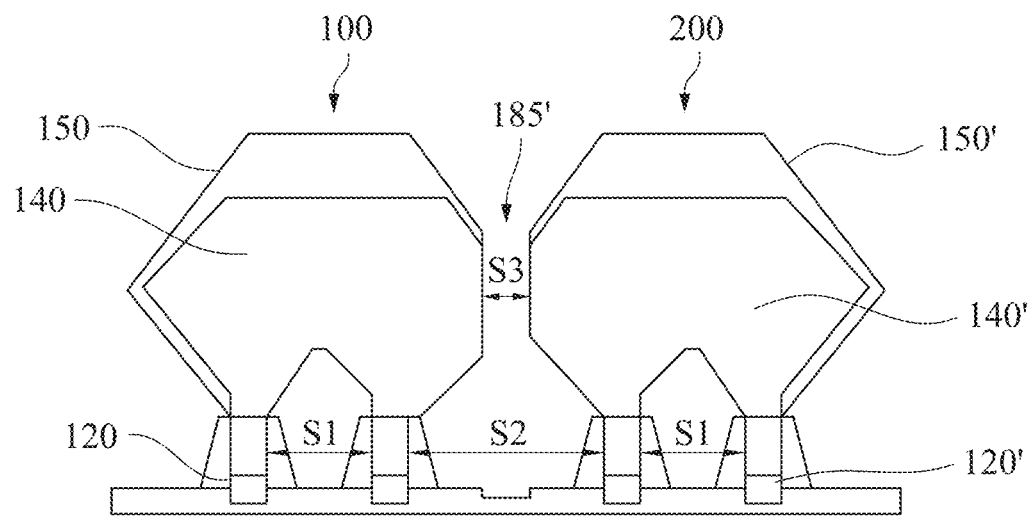
FIG. 20 shows a cross sectional view of one of the various stages for manufacturing a FinFET device according to another embodiment of the present disclosure.

After separating the devices, the photoresist 160 is removed, as shown in FIG. 20 using a suitable photoresist stripper or ashing operation. In some embodiments, the source/drain structures 140, 150, 140', 150' of adjacent semiconductor devices 100, 200 are separated by a distance S3 of about 2 to 20 nm at the gap 185'. In some embodiments, the source/drain structures 140, 150, 140', 150' of adjacent semiconductor devices 100, 200 are separated by a distance S3 of about 5 to 10 nm.

In some embodiments, a pair of adjacent first fin structures 120 are spaced apart by a distance S1 and a pair of adjacent second fin structures 120' are spaced apart by the distance S1. A first fin structure 120 is spaced apart from a second fin structure 120' by a distance S2. The first merged source/drain structure 140, 150 is spaced apart from the second merged source/drain structure 140', 150' at the gap 185' by the distance S3. In some embodiments, the distance S1 ranges from about 10 nm to about 50 nm. In other embodiments, the distance S1 ranges from about 15 nm to about 40 nm. In some embodiments, the distance S2 ranges from about 25 nm to about 75 nm. In other embodiments, the distance S2 ranges from about 30 nm to about 65 nm. In some other embodiments, the distance S2 ranges from about 40 nm to about 60 nm.

In some embodiments, a ratio of S2/S3 ranges from about 1.25/1 to about 25/1. In other embodiments the ratio S2/S3 ranges from about 2/1 to about 15/1. In other embodiments, the ratio S2/S3 ranges from about 5/1 to about 10/1. In some embodiments, a ratio S2/S1 ranges from about 1.5/1 to about 7.5/1. In other embodiments, the ratio S2/S1 ranges from about 2.5/1 to about 5/1.

In some embodiments, a ratio of the height RH of a source/drain structure measured from the top of the fin structure to the distance S3 between adjacent source/drain structures (RH/S3) ranges from 1/1 to 75/1. In some embodiments, RH/S3 ranges from 3/1 to 10/1. In some embodiments, a ratio of the height RH of a source/drain structure measured from a top of the fin structure to the distance S2 between the fin structures of adjacent transistor structures (RH/S2) ranges from 1/1 to 8/1. In some embodiments, RH/S2 ranges from 2/1 to 5/1. Due to the crystal orientation of the substrate formed into the fin structures 120 (e.g., (100) plane), the epitaxial source/drain structures 140, 150, 140', 150' have a higher lateral growth rate and the vertical growth rate away from the substrate, the epitaxial source/drain structures 140, 150, 140', 150' resulting in a diamond-like shape in some embodiments. The diamond-like shape is prominent on the outer edges of the source/drain structures 140, 150, 140', 150' of the adjacent devices 100, 200, while the top portion of the source drain structures are flat because of differences in the growth rate of the upper lattice face and outer edge lattice faces. The inner edges of the source/drain structures 140, 150, 140', 150' of the adjacent devices 100, 200 are flattened in the vertical direction because of the etching operation to separate the first and second semiconductor devices 100, 200. In some embodiments, the etching operation is a plasma dry etching operation.

Figure 21:
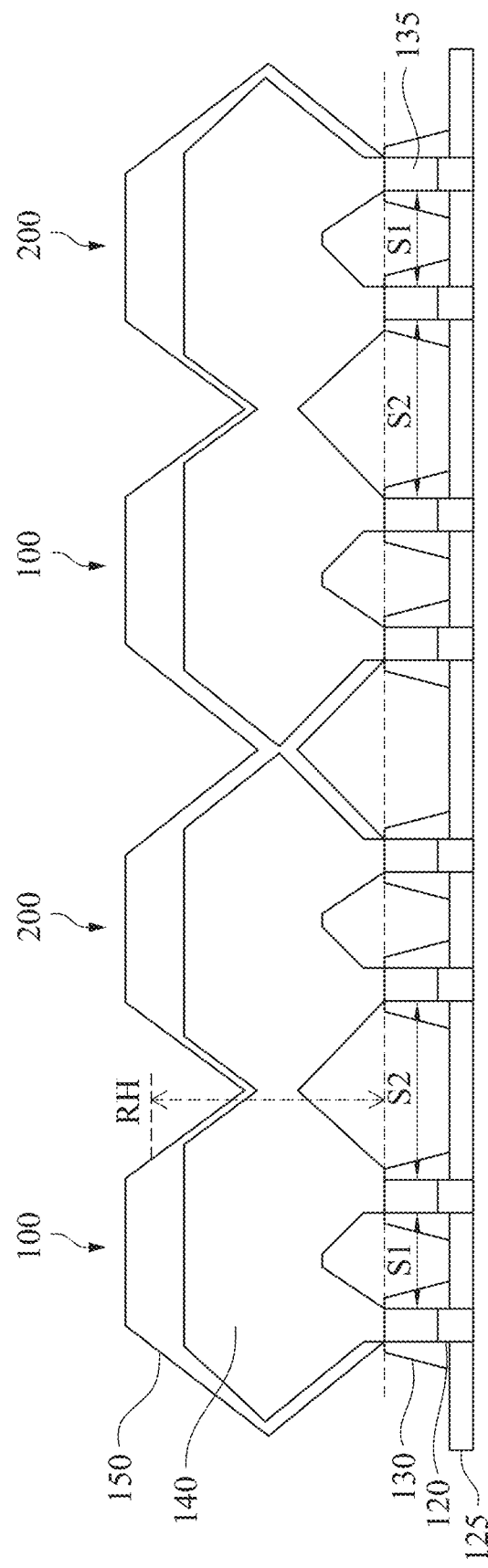
FIG. 21 shows a cross sectional view of one of the various stages for manufacturing a FinFET device according to another embodiment of the present disclosure.

In some embodiments of the disclosure, a plurality of first and second semiconductor devices 100, 200, such as first and second FinFETs, are formed on a semiconductor substrate. As shown in FIG. 21, a two first semiconductor devices 100 and two second semiconductor devices 200 are formed on a semiconductor substrate. Although four semiconductor devices formed on the substrate in this embodiment, more than four semiconductor devices may be formed or three semiconductor devices may be formed. The semiconductor devices are formed by the methods disclosed herein in reference to FIGS. 1-11 and 17. The source/drain structures 140, 150, 140', 150' of the four semiconductor devices are merged. Each fin structure 120 of a semiconductor device is spaced apart from a closest adjacent fin structure of the same semiconductor device by the distance S1. Closest adjacent fin structures 120 of adjacent semiconductor devices 100, 200 are spaced apart by a distance S2, wherein S2>S1.

Figure 22:
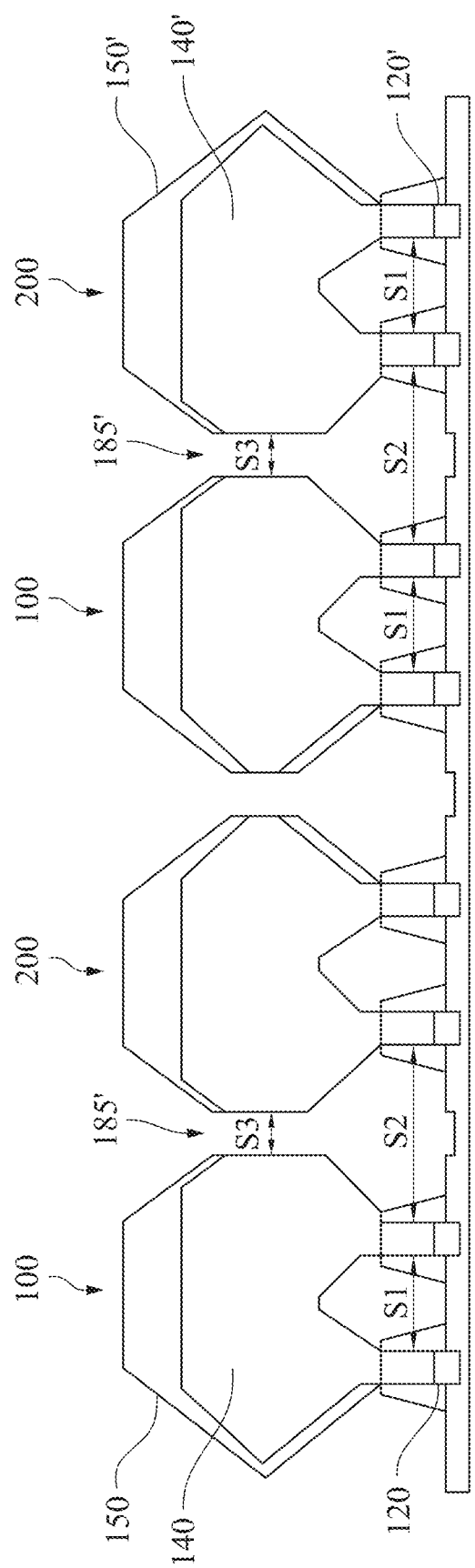
FIG. 22 shows a cross sectional view of one of the various stages for manufacturing a FinFET device according to another embodiment of the present disclosure.

As shown in FIG. 22, the source/drain structures 140, 150, 140', 150' are separated by cutting the merged source/drain structure, thereby separating the semiconductor devices 100, 200. The merged source/drain structure is cut at locations where the closest adjacent fin structures of adjacent semiconductors are separated by the distance S2. The operations of separating semiconductor devices can be performed as disclosed herein in reference to FIGS. 11-13 and FIGS. 18-20. In some embodiments, spaced apart source/drain structures are separated by a gap having distance S3 ranging from about 2 nm to about 20 nm. In some embodiments, S3 ranges from about 5 nm to about 10 nm. In some embodiments, a ratio S2/S1 ranges from 1.5/1 to 7.5/1. In some embodiments, the merged source/drain structure is not cut at locations where adjacent fin structures are spaced apart by the distance S1.

After forming the gap, an interlayer dielectric (ILD) layer is formed over the source/drain structures 140, 150, 140', 150' in some embodiments. Further, vias may be formed in the ILD and CESL, and a silicide layer and electrically conductive contacts may be formed over the exposed source/drain structures 140, 150, 140', 150'. In addition, further CMOS processes are performed to form various features such as additional interlayer dielectric layer, contacts/vias, interconnect metal layers, and passivation layers, etc.

In the present disclosure, increased device density is provided because transistors are formed closer together. The transistors can be spaced closer to each other because rather than avoiding source/drain structure merger of adjacent transistors, and source/drain structures are purposely merged according to embodiments of the present disclosure. The merged source/drain structures are subsequently etched to separate adjacent devices.

In an embodiment of the present disclosure, a method of manufacturing a semiconductor device includes forming a first transistor structure and a second transistor structure on a substrate, wherein source/drain structures of the first transistor structure and the second transistor structure are merged. The first and second transistor structures are separated by etching the source/drain structures. In an embodiment, before separating the first and second transistors, the method includes forming a silicide layer over the merged source/drain structures, forming an interlayer dielectric layer over the merged source/drain structures, and forming a gap in the interlayer dielectric layer in a region between the first and the second transistors. In an embodiment, the silicide layer is formed before forming the interlayer dielectric layer. In an embodiment, the silicide layer is formed after the gap is formed. In an embodiment, the gap exposes a portion of the source/drain structures, and the portion of source/drain structures that is exposed is etched during the etching the source/drain structures. In an embodiment, the method includes forming an etch stop layer over the silicide layer.

In another embodiment of the present disclosure, a method of manufacturing a semiconductor device including a plurality of fin field effect transistors (FinFET)s includes forming a first fin structure and a second fin structure over a substrate, the first and second fin structures extend in a first direction in plan view. An isolation insulating layer is formed over the substrate so that lower portions of the first and second fin structures are embedded in the isolation insulating layer and upper portions of the first and second fin structures are exposed from the isolation insulating layer. A gate structure is formed over parts of the first and second fin structures. The gate structure includes a gate pattern, a dielectric layer disposed between the gate pattern and the first and second fin structures, and a cap insulating layer disposed over the gate pattern. The gate structure extends in a second direction crossing the first direction in plan view. Upper portions of the first and second fin structures are recessed. An epitaxial source/drain structure is formed over the recessed first fin structure. The epitaxial source/drain structure is a merged structure such that a void is formed between the merged epitaxial source/drain structure and the isolation insulating layer. A portion of the merged epitaxial structure between the first and second fin structures is etched to form a first epitaxial source/drain structure and a second epitaxial source/drain structure. In an embodiment, a fin sidewall is formed on sidewalls of the first and second fin structures protruding from the isolation insulating layer and not covered by the gate structure, and on an upper surface of the isolation insulating layer after forming the gate structure, and in the recessing upper portions of the first and second fin structures a portion of the fin sidewall disposed on the side surfaces of the fin structures is removed and a portion of the fin sidewall disposed on lower side surfaces of the fin structures remains. In an embodiment, in the recessing upper portions of the first and second fin structures, the first and second fin structures are recessed down below the upper surface of the isolation insulating layer. In an embodiment, after the first and second epitaxial source/drain structures are formed, the method includes forming a silicide layer on the merged first and second epitaxial source/drain structures, forming an interlayer dielectric layer, and forming a gap in the interlayer dielectric layer. In an embodiment, the silicide layer is formed before forming the interlayer dielectric layer. In an embodiment, the silicide layer is formed after the opening is formed. In an embodiment, the method includes forming an etch stop layer over the silicide layer. In an embodiment, after the first and second epitaxial source/drain structures are formed, the method includes removing the cap insulating layer, the gate pattern and the dielectric layer so as to make a gate space, forming a gate dielectric layer in the gate space, and forming a gate electrode on the gate dielectric layer in the gate space. In an embodiment, the gate dielectric layer is formed of a high-k material. In an embodiment, the first and second source/drain structures comprise a first region comprising SiP having a first P concentration and a second region over the first region having a second P concentration, where the second P concentration is less than the first P concentration.

In another embodiment of the disclosure a method of manufacturing a semiconductor device includes forming a first plurality of fin structures and a second plurality of fin structures over a substrate, the first plurality and second fin structures extending in a first direction in plan view. An isolation insulating layer is formed over the substrate so that lower portions of the first plurality of fin structures and the second plurality of fin structures are embedded in the isolation insulating layer and upper portions of the first plurality of fin structures and the second plurality of fin structures are exposed from the isolation insulating layer. A gate structure is formed over parts of the first plurality of fin structures and the second plurality of fin structures. The gate structure extends in a second direction crossing the first direction in plan view. First upper portions of the first plurality of fin structures and second upper portions of the second plurality of fin structures are recessed. A merged source/drain structure is formed over the recessed portions of the first plurality of fin structures and the second plurality of fin structures. Voids are formed between adjacent fin structures of the first plurality of fin structures and the second plurality of fin structures. A portion of the merged source/drain structure between the first plurality of fin structures and the second plurality of fin structures is etched to separate the first plurality of fin structures and the second plurality of fin structures. In an embodiment, after the merged source/drain structure is formed, the method includes forming a silicide layer on the merged source/drain structure, forming an interlayer dielectric layer, and forming a gap in the interlayer insulating layer. In an embodiment, the silicide layer is formed before forming the interlayer dielectric layer. In an embodiment, the silicide layer is formed after the opening is formed.

In another embodiment of the disclosure, a method of manufacturing a semiconductor device includes forming a first group of fin structures and a second group of fin structures on a semiconductor substrate. Each fin structure of the first group of fin structures is spaced apart from a closest adjacent fin structure of the first group of fin structures by a distance S1. Each fin structure of the second group of fin structures is spaced apart from a closest adjacent fin structure of the second group of fin structures by the distance S1. Closest adjacent fin structures of the first group of fin structures and the second group of fin structures are spaced apart by a distance S2, and S2>S1. Source/drain structures are formed over each fin structure of the first group and second group of fin structures, such that the source/drain structures merge to form a merged source/drain structure. The merged source/drain structure is cut at a location where closest adjacent fin structures of the first group and second group of fin structures are separated by the distance S2 to separate the merged source/drain structure into two spaced apart source/drain structures. In an embodiment, the two spaced apart source/drain structures ranges are separated by a distance ranging from 2 nm to 20 nm. In an embodiment, a ratio S2/S1 ranges from 1.5/1 to 7.5/1. In an embodiment, the method includes forming a plurality of first groups and second groups of fin structures on the semiconductor substrate. In an embodiment, the method includes cutting the merged source/drain structure at a plurality of locations where closest adjacent fin structures of corresponding first groups and second groups are spaced apart by the distance S2. In an embodiment, the merged source/drain structure is not cut at locations where adjacent fin structures are spaced apart by the distance S1.

In another embodiment of the disclosure, a method of manufacturing a semiconductor device includes forming a first fin structure, a second fin structure, a third fin structure, and a fourth fin structure on substrate. The first fin structure and the second fin structure are spaced apart by a distance S1, and the third fin structure and the fourth fin structure are spaced apart by the distance S1. A shortest distance between either of the first fin structure and second fin structure, and either of the third fin structure and fourth fin structure is a distance S2, and S2>51. Source/drain structures are formed over the first fin structure, second fin structure, third fin structure, and fourth fin structure, such that the source/drain structures merge to form a merged source/drain structure. The merged source/drain structure is cut at a location where two adjacent fin structures are separated by the distance S2 to separate the merged source/drain structure into two spaced apart source/drain structures. In an embodiment, a gap between the two spaced apart source/drain structures ranges from 2 nm to 20 nm. In an embodiment, a ratio S2/S1 ranges from 1.5/1 to 7.5/1.

In another embodiment of the disclosure, a semiconductor device having a plurality of transistors disposed over a common substrate includes a first transistor including a plurality of first fin structures and a second transistor comprising a plurality of second fin structures. A first merged source/drain structure is disposed over the first plurality of fin structures and a second merged source drain structure is disposed over the second plurality of fin structures. A pair of adjacent first fin structures are spaced apart by a distance S1 and a pair of adjacent second fin structures are spaced apart by the distance S1. A first fin structure is spaced apart from a second fin structure by a distance S2. The first merged source/drain structure is spaced apart from the second merged source/drain structure by a distance S3, and a ratio of S2/S3 ranges from 1.25/1 to 25/1. In an embodiment, a ratio S2/S1 ranges from 1.5/1 to 7.5/1. In an embodiment, S3 ranges from 2 nm to 20 nm. In an embodiment, the first and second merged source/drain structures each include a first region including SiP having a first P concentration and a second region over the first region having a second P concentration, where the second P concentration is less than the first P concentration.

In another embodiment of the disclosure, a semiconductor device including a plurality of transistors disposed over a common substrate includes a first transistor comprising a plurality of first fin structures and a second transistor comprising a plurality of second fin structures. A first merged source/drain structure is disposed over the first plurality of fin structures, and a second merged source drain structure disposed over the second plurality of fin structures. A pair of adjacent first fin structures are spaced apart by a distance S1 and a pair of adjacent second fin structures are spaced apart by the distance S1. One of the first fin structures is spaced apart from one of the second fin structures adjacent to the one of the first fin structures by a distance S2, wherein 10 nm<S1<50 nm, 25 nm<S2<75 nm, and S2>S1. In an embodiment, 5 nm<S1<40 nm. In an embodiment, 30 nm<S2<65 nm. In an embodiment, 40 nm<S2<60 nm. In an embodiment, the first merged source/drain structure is spaced apart from the second merged source/drain structure by a distance S3, and 2 nm<S3<20 nm. In an embodiment, 5 nm<S3<10 nm. In an embodiment, the first and second merged source/drain structures each comprise a first region comprising SiP having a first P concentration and a second region over the first region having a second P concentration, where the second P concentration is less than the first P concentration. In an embodiment, the semiconductor device includes an interlayer dielectric layer disposed over the first and second merged source/drain structures. In an embodiment, the semiconductor device includes first and second electrically conductive contacts extending through the interlayer dielectric layer and in electrical contact with the first and second merged source/drain structures, respectively. In an embodiment, the semiconductor device includes a silicide layer disposed between the first and second electrically conductive contacts and the first and second merged source/drain structures. In an embodiment, a height of the first merged source/drain structure measured from a top of the first fin structures ranges from 20 nm to 150 nm.

In another embodiment of the disclosure, a semiconductor device includes a first transistor and a second transistor disposed over a common substrate, including a first transistor including a plurality of first fin structures and a second transistor including a plurality of second fin structures. A first merged source/drain structure is disposed over the first plurality of fin structures, and a second merged source drain structure disposed over the second plurality of fin structures. A pair of adjacent first fin structures are spaced apart by a distance S1 and a pair of adjacent second fin structures are spaced apart by the distance S1. One of the first fin structures is spaced apart from one of the second fin structures adjacent to the one of the first fin structures by a distance S2, and a ratio S2/S1 ranges from 1.5/1 to 7.5/1. In an embodiment, S2/S1 ranges from 2.5/1 to 5/1. In an embodiment, the first merged source/drain structure is spaced apart from the second merged source/drain structure by a distance S3, and 2 nm<S3<20 nm. In an embodiment, a ratio of a height RH of one of the first and second merged source/drain structures measured from a top of one of the first or second fin structures, respectively, to the distance S3 (RH/S3) ranges from 1/1 to 75/1. In an embodiment, RH/S3 ranges from 3/1 to 10/1. In an embodiment, a ratio of a height RH of one of the first and second merged source/drain structures measured from a top of one of the first and second fin structures, respectively, to the distance S2 (RH/S2) ranges from 1/1 to 8/1. In an embodiment, RH/S2 ranges from 2/1 to 5/1.

It will be understood that not all advantages have been necessarily discussed herein, no particular advantage is required for all embodiments or examples, and other embodiments or examples may offer different advantages.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a first transistor structure and a second transistor structure on a substrate, wherein source/drain structures of the first transistor structure and the second transistor structure are merged;
   forming a silicide layer over the merged source/drain structures;
   forming an interlayer dielectric layer over the merged source/drain structures;
   forming a gap in the interlayer dielectric layer in a region between the first and the second transistors; and
   separating the first and second transistor structures by etching the merged source/drain structures.

2. The method according to claim 1, wherein the silicide layer is formed before forming the interlayer dielectric layer.

3. The method according to claim 1, wherein the silicide layer is formed after the gap is formed.

4. The method according to claim 1, wherein the gap exposes a portion of the source/drain structures, and the portion of source/drain structures that is exposed is etched during the etching the source/drain structures.

5. The method according to claim 1, further comprising forming an etch stop layer over the silicide layer.

6. The method according to claim 1, further comprising forming a photoresist layer over the interlayer dielectric layer.

7. A method of manufacturing a semiconductor device including a plurality of fin field effect transistors (FinFETs), the method comprising:
   forming a first fin structure and a second fin structure over a substrate, the first and second fin structures extending in a first direction in plan view,
   forming an isolation insulating layer over the substrate so that lower portions of the first and second fin structures are embedded in the isolation insulating layer and upper portions of the first and second fin structures are exposed from the isolation insulating layer;
   forming a gate structure over parts of the first and second fin structures, the gate structure including a gate pattern, a dielectric layer disposed between the gate pattern and the first and second fin structures, and a cap insulating layer disposed over the gate pattern, the gate structure extending in a second direction crossing the first direction in plan view;
   recessing upper portions of the first and second fin structures,
   forming an epitaxial source/drain structure over the recessed first fin structure and the recessed second fin structure,
   wherein the epitaxial source/drain structure is a merged structure such that a void is formed between the merged source/drain structure and the isolation insulating layer; and
   etching a portion of the merged epitaxial structure between the first and second fin structures to form a first epitaxial source/drain structure and a second epitaxial source/drain structure.

8. The method according to claim 7, further comprising forming a fin sidewall on sidewalls of the first and second fin structures protruding from the isolation insulating layer and not covered by the gate structure, and on an upper surface of the isolation insulating layer after forming the gate structure,
   wherein in the recessing upper portions of the first and second fin structures, a portion of the fin sidewall disposed on the side surfaces of the fin structures is removed and a portion of the fin sidewall disposed on lower side surfaces of the fin structures remains.

9. The method according to claim 7, wherein in the recessing upper portions of the first and second fin structures, the first and second fin structures are recessed down below the upper surface of the isolation insulating layer.

10. The method according to claim 7, further comprising, after the first and second epitaxial source/drain structures are formed:
    forming a silicide layer on the merged first and second epitaxial source/drain structures;
    forming an interlayer dielectric layer; and
    forming a gap in the interlayer dielectric layer.

11. The method according to claim 10, wherein the silicide layer is formed before forming the interlayer dielectric layer.

12. The method according to claim 10, wherein the silicide layer is formed after the opening is formed.

13. The method according to claim 10, further comprising forming an etch stop layer over the silicide layer.

14. The method according to claim 7, further comprising, after the first and second epitaxial source/drain structures are formed:
    removing the cap insulating layer, the gate pattern and the dielectric layer so as to make a gate space;
    forming a gate dielectric layer in the gate space; and
    forming a gate electrode on the gate dielectric layer in the gate space.

15. The method according to claim 14, wherein the gate dielectric layer is formed of a high-k material.

16. The method according to claim 7, wherein the first and second source/drain structures comprise a first region comprising SiP having a first P concentration and a second region over the first region having a second P concentration, where the second P concentration is less than the first P concentration.

17. A semiconductor device comprising a plurality of transistors disposed over a common substrate, comprising:
    a first transistor comprising a plurality of first fin structures and a second transistor comprising a plurality of second fin structures;
    a first merged source/drain structure disposed over the first plurality of fin structures; and
    a second merged source drain structure disposed over the second plurality of fin structures,
    wherein a pair of adjacent first fin structures are spaced apart by a distance Si and a pair of adjacent second fin structures are spaced apart by the distance S1,
    wherein one of the first fin structures is spaced apart from one of the second fin structures adjacent to the one of the first fin structures by a distance S2,
    wherein the first merged source/drain structure is spaced apart from the second merged source/drain structure by a distance S3, and
    a ratio of S2/S3 ranges from 1.25/1 to 25/1, and
    wherein the first and second merged source/drain structures each comprise a first region comprising SiP having a first P concentration and a second region over the first region having a second P concentration, where the second P concentration is less than the first P concentration.

18. The semiconductor device of claim 17, wherein a ratio S2/S1 ranges from 1.5/1 to 7.5/1.

19. The semiconductor device of claim 17, wherein S3 ranges from 2 nm to 20 nm.

20. The semiconductor device of claim 17, wherein S2 ranges from 25 nm to 75 nm.

* * * * *